US012713883B2

(12) United States Patent
Chou et al.

(10) Patent No.: US 12,713,883 B2
(45) Date of Patent: Aug. 18, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chih-Chao Chou, Hsinchu (TW); Chih-Hao Wang, Hsinchu (TW); Ching-Wei Tsai, Hsinchu (TW); Shang-Wen Chang, Hsinchu (TW); Yi-Hsun Chiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 515 days.

(21) Appl. No.: 18/205,512

(22) Filed: Jun. 3, 2023

(65) Prior Publication Data

US 2024/0404881 A1 Dec. 5, 2024

(51) Int. Cl.
*H10W 20/00* (2026.01)
*H10W 20/42* (2026.01)

(52) U.S. Cl.
CPC ....... *H10W 20/058* (2026.01); *H10W 20/074* (2026.01); *H10W 20/096* (2026.01); *H10W 20/42* (2026.01)

(58) Field of Classification Search
CPC ............. H10W 20/058; H10W 20/074; H10W 20/096; H10W 20/42; H01L 21/7688; H01L 21/76826; H01L 21/76829; H01L 23/5226; H01L 2224/0237; H01L 2224/0231; H01L 21/67075; H05K 3/0051; H05K 3/0041; G12B 15/06; H01B 7/421
See application file for complete search history.

(56) References Cited

U.S. PATENT DOCUMENTS

| | | | | |
|---|---|---|---|---|
| 6,730,998 | B1 * | 5/2004 | Williams | B33Y 80/00 257/713 |
| 2007/0184581 | A1 | 8/2007 | Hsu et al. | |
| 2011/0000224 | A1 * | 1/2011 | Ghoshal | H10N 10/817 438/54 |
| 2017/0301611 | A1 * | 10/2017 | Cheng | H01L 21/76898 |
| 2018/0350660 | A1 * | 12/2018 | Tsai | H01L 21/76251 |
| 2020/0312741 | A1 * | 10/2020 | Wan | H01L 23/38 |
| 2021/0167754 | A1 * | 6/2021 | Inoue | H03H 9/1057 |
| 2022/0310477 | A1 * | 9/2022 | Lee | H01L 21/76802 |
| 2023/0230852 | A1 * | 7/2023 | Plotnikov | B22F 3/11 165/186 |

* cited by examiner

*Primary Examiner* — Galina G Yushina
(74) *Attorney, Agent, or Firm* — NZ Carr Law Office

(57) ABSTRACT

A semiconductor device structure and methods of forming the same are described. In some embodiments, the method includes depositing an etch stop layer on a substrate, depositing a first substrate layer on the etch stop layer, forming a plurality of active devices on the first substrate layer, forming an interconnection structure over the active devices, flipping over the substrate, removing the substrate, removing the etch stop layer to expose the first substrate layer, and forming a cooling substrate layer on the exposed first substrate layer. The cooling substrate layer has a thermal conductivity substantially greater than a thermal conductivity of the substrate.

20 Claims, 15 Drawing Sheets

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Whenever an IC is operating, current flowing through an impedance such as a component, an interconnection, a wiring, or a redistribution layer, causes energy losses. The energy losses manifest themselves as heat. With semiconductor devices, the component gates shrunk down to nanometer size results in millions of gates formed from billions of transistors in a single die. While each new generation of smaller and faster devices offers more features to play with, these devices generate more heat in the same component footprint.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIGS. 1-11 shows various stages for manufacturing a wafer device according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Excessive heating of semiconductor devices can have several impacts on the operation of the devices. The properties of the semiconductor material itself change with temperature due to electromigration. The device performance may not adhere to its specification and function abnormally beyond the temperature limit of the semiconductor material. When the semiconductor devices are bonded with a die substrate through a redistribution layer, the bonding integrity may be comprised at high temperature. The heat stress effect may occur when the device is switched on, off, or subject to pulsed loading effects. The die may be subject to rapid temperature change when it changes state. When semiconductor devices composed of the die bonded to an insulating substrate connected to a copper base plate, the thermal stresses may distort different layers within the semiconductor device. Various materials used in the manufacture of the device expand at different rates. Fractures or delamination in materials may occur or the application of stress forces on the die caused by expansion of encapsulation materials. This leads to the premature failure of the device adversely affecting the reliability.

Manufacturing of a semiconductor chip may be divided into three stages of processes, including front-end-of-line (FEOL) stage, middle-of-line (MOL) stage, and back-end-of-line (BEOL) stage. The FEOL covers the processing of the active parts of the chips, that is, the transistors often formed on the bottom of the chip. The transistor serves as an electrical switch and uses a gate, a source, and a drain for operation. Electrical current in a conduction channel between source and drain is controlled by the gate voltage to switch on and off. In the BEOL, interconnections, which are complex wiring schemes that distribute clock and other signals, are formed to provide power and ground and transfer electrical signals from one transistor to another. The structure during BEOL is organized in different metal layers, local, intermediate, semi-global, and global wires. Each of these metal layers includes metal lines and dielectric layers in a horizontal plane. The metal lines of different metal layers are interconnected vertically by vias structures. The FEOL and BEOL are tied together by the MOL. The structure formed in the MOL may be made up of metal structures to serve as contacts to source, drain, and the gate of the transistors.

According to some embodiments, a substrate structure that provides more efficient heat dissipation of heat generated from the transistors is used for forming a semiconductor chip. The substrate is provided and processed for forming various devices thereon in the FEOL stage. The substrate is further processed after the BEOL stage and before the packaging of the semiconductor chip. A detail description of the substrate structure with improved heat dissipation will be provided with references to FIGS. 1 to 12.

In FIG. 1, a substrate 10 is provided. The substrate 10 includes a single crystalline semiconductor layer on at least the surface of the substrate 10. The substrate 10 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 10 is made of Si. In some embodiments, the substrate 10 is a silicon-on-insulator (SOI) substrate, which includes an insulating layer (not shown) disposed between two silicon layers. In one aspect, the insulating layer is an oxide.

Figure 2:
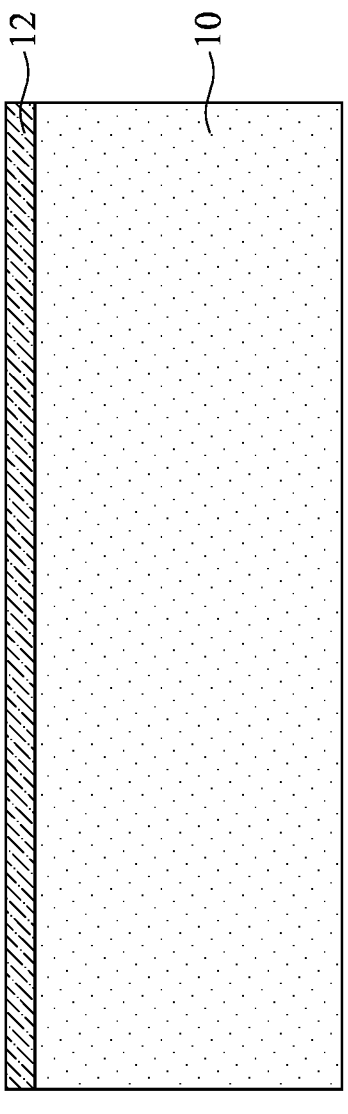

In FIG. 2, an etch stop layer 12 is formed on the substrate 10. When the substrate 10 is made of Si, material such as SiGe that has a different etching rate from Si is selected for forming the etch stop layer 12. The etch stop layer 12 may be formed by using all suitable processes such as chemical vapor deposition (CVD), atmosphere pressure (APCVD), or molecular beam epitaxy (MBE). In some embodiments, the SiGe may be epitaxially grown on the Si substrate 10 as the etch stop layer 12.

Figure 3:
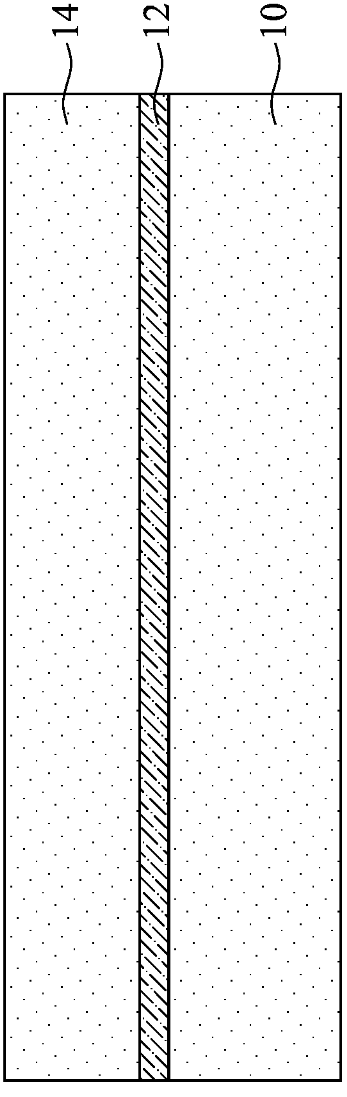

In FIG. 3, a substrate layer 14 is formed on the etch stop layer 12. The substrate layer 14 may include a single crystalline semiconductor layer on at least the surface of the etch stop layer 12. The substrate layer 14 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate layer 14 is made of Si. The substrate layer 14 may be made of Si formed by CVD, APCVD, MBE, or all other suitable processes. The Si substrate layer 14 may be epitaxially grown on the etch stop layer 12 made of SiGe in according to one embodiment. One or more buffer layers (not shown) may be formed on the surface of the substrate layer 14. The buffer layers can serve to gradually change the lattice constant from that of the substrate to that of the source/drain (S/D) regions to be grown on the substrate layer 14. The buffer layers may be formed from epitaxially grown single crystalline semiconductor materials such as, but not limited to Si, Ge, germafnium tin (GeSn), SiGe, GaAs, InSb, GaP, GaSb, InAlAs, InGaAs, GaSbP, GaAsSb, GaN, GaN, and InP. In one embodiment, the substrate layer 14 includes SiGe buffer layers epitaxially grown on the Si substrate layer 14. The germanium concentration of the SiGe buffer layers may increase from 30 atomic percent germanium for the bottom-most buffer layer to 70 atomic percent germanium for the top-most buffer layer. The substrate layer 14 may include various regions that have been suitably doped with impurities (e.g., p-type or n-type impurities). The dopants are, for example boron for an n-type field effect transistor FET (NFET) and phosphorus for a p-type FET (PFET).

Figure 4:
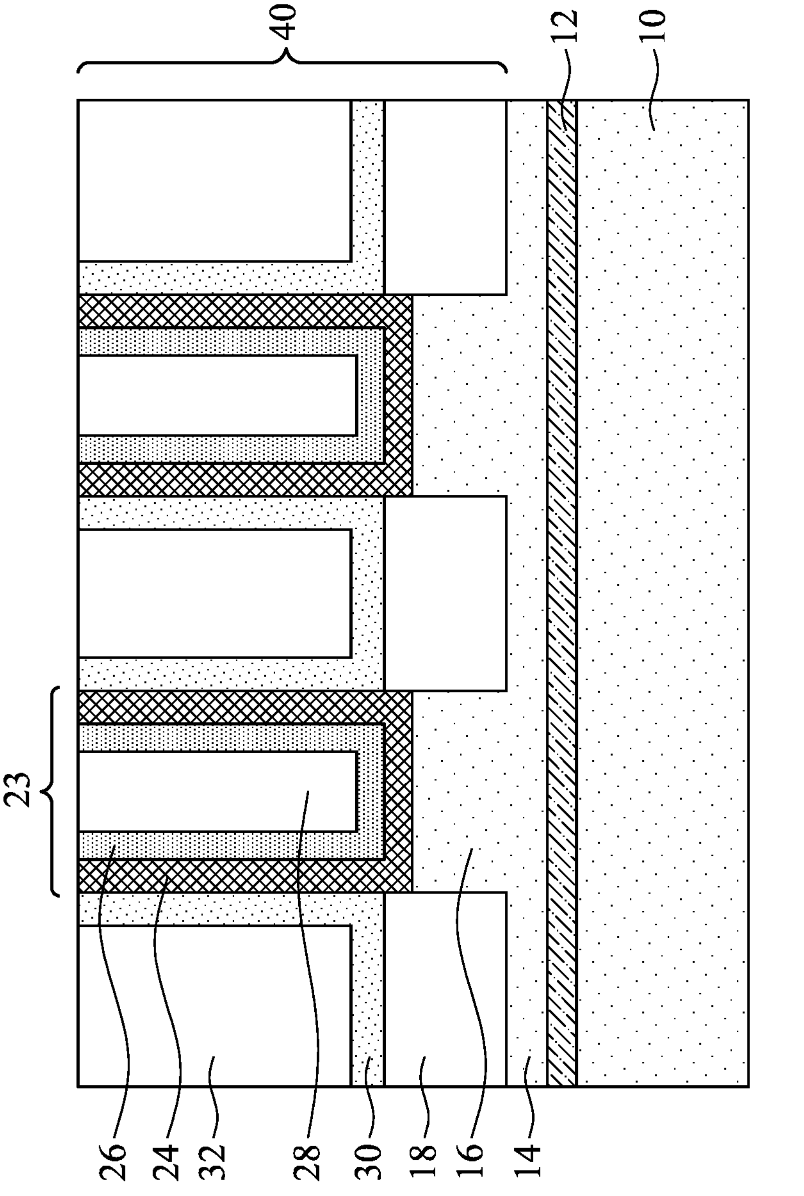

Various components and devices may be formed on the stack of the substrate 10, the etch stop layer 12, and the substrate layer 14 in the front-end of line (FEOL) stage. For example, the semiconductor devices may include both active and passive devices such as transistors, diodes, imaging sensors, resistors, capacitors, inductors, memory cells, or a combination thereof formed on the substrate layer 14. In some embodiments, the active devices include transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device formed between the substrate layer 14 and the interconnection structures to be formed in the BEOL stage may be a FinFET as shown in FIG. 4. The exemplary device may include source/drain (S/D) regions 18 and a gate stack 23 disposed between the adjacent S/D regions 18. Channel regions 16 are formed between the adjacent S/D regions 18.

The S/D regions 18 may include a semiconductor material, such as Si or Ge, a III-V compound semiconductor, an II-VI compound semiconductor, or other suitable semiconductor material. Exemplary S/D regions 18 may include, but are not limited to, Ge, SiGe, GaAs, AlGaAs, GaAsP, SiP, InAs, AlAs, InP, GaN, InGaAs, InAlAs, GaSb, AIP, GaP, and the like. The S/D regions 18 may include p-type dopants, such as boron; n-type dopants, such as phosphorus or arsenic; and/or other suitable dopants including combinations thereof. The S/D regions 104 may be formed by an epitaxial growth method using CVD, atomic layer deposition (ALD) or molecular beam epitaxy (MBE). In this disclosure, a source region and a drain region are interchangeably used, and the structures thereof are substantially the same. Furthermore, source/drain region(s) may refer to a source or a drain, individually or collectively dependent upon the context. The channel regions 16 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 16 include the same semiconductor material as the substrate layer 14. In some embodiments, the devices are FinFETs, and the channel regions 16 are a plurality of fins each having at least three surfaces wrapped around by the gate stacks 23. In some other embodiments, the devices are nanosheet transistors, and the channel regions 16 include two or more nanosheets surrounded by the gate stacks 23.

Each gate stack 23 includes a gate electrode layer 28 disposed over the channel region 16 or partially/fully surrounding the channel region 16. The gate electrode layer 28 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 23 may further include a gate dielectric layer 26 on which the gate electrode layer 28 is formed. The gate dielectric layer 26 may include a dielectric material such as an oxygen-containing material or a nitrogen-containing material, a high-k dielectric material having a k value greater than that of silicon dioxide, or multilayers thereof. The gate dielectric layer 26 may be formed by any suitable method, such as CVD, PECVD, or ALD.

One or more gate spacers 24 are formed along sidewalls of the gate stack 23 (e.g., sidewalls of the gate dielectric layer 26). The gate spacers 24 may include silicon oxycarbide, silicon nitride, silicon oxynitride, silicon carbon nitride, the like, multi-layers thereof, or a combination thereof, and may be deposited by CVD, PVD, ALD, or other suitable deposition technique. In the embodiment as shown in FIG. 4, the transistor device, including the gate 23, the S/D regions 18, and the channel regions 16 are formed on the substrate layer 14 that has been formed on the etch stop layer 12 and the substrate 10.

A contact etch stop layer (CESL) 30 is formed on the S/D regions 18. The CESL 30 may be conformally deposited on surfaces of the S/D regions 18. The CESL 30 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, PVD, ALD, or any suitable deposition technique. A conductive contact 32 is disposed on the CESL 30. The conductive contact 32 may include a material having one or more of Ru, Mo, Co, Ni. W, Ti, Ta, Cu, Al, TiN or TaN, and the conductive contact 32 may be formed by any suitable method, such as electro-chemical plating (ECP), or PVD.

Figure 5:
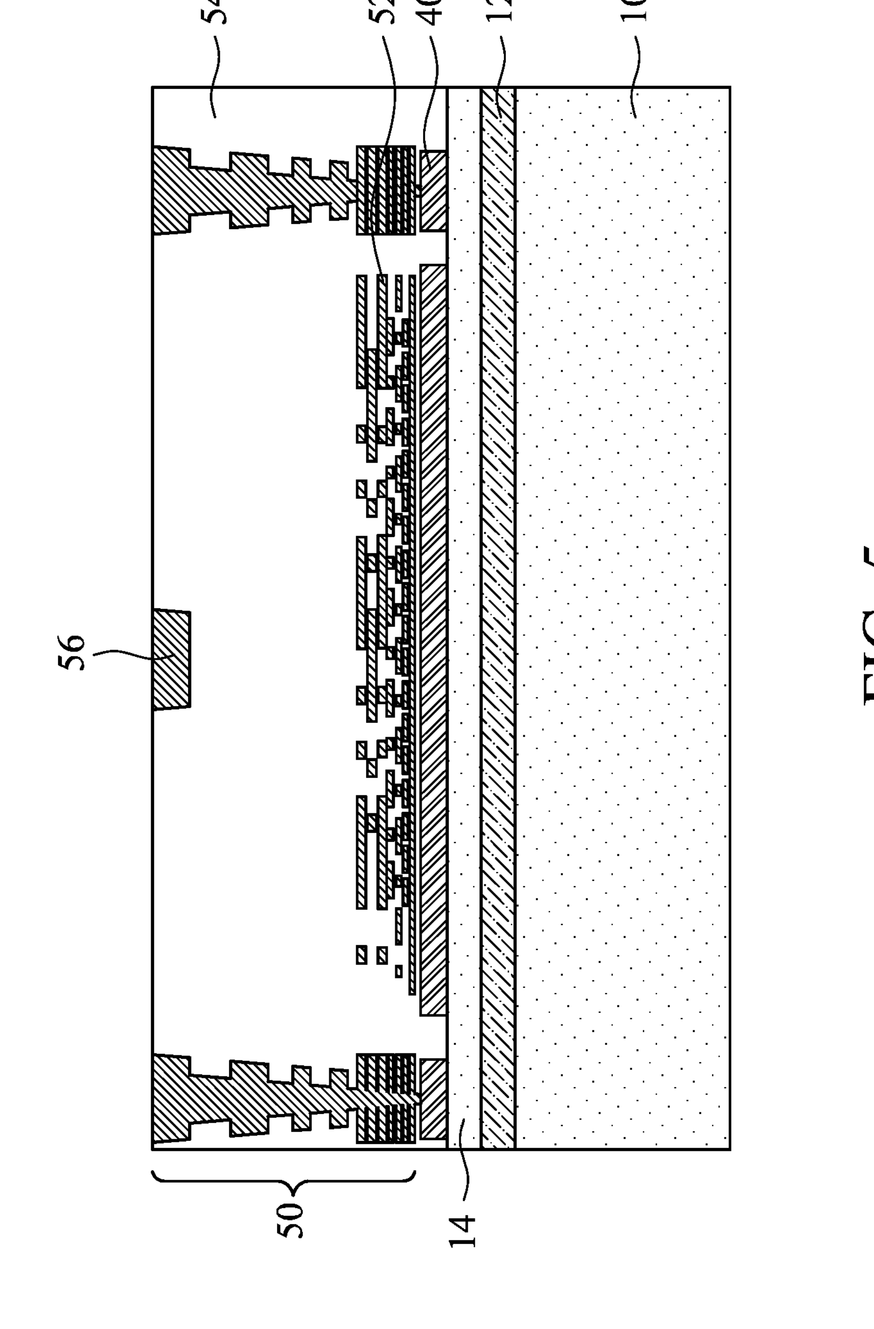

Once a predetermined number of active devices 40, such as the semiconductor devices as shown in FIG. 4 and other devices are formed, electrical contacts (not shown) for the active devices 40 are formed in the MOL process. The BEOL is then performed to form metallization, that is, the interconnection structure 50 as shown in FIG. 5. As discussed above, the interconnection structure 50 may include multiple metal layers 52. Each one of the metal layers 52 includes metal lines and dielectric layer through which the metal lines extend horizontally. Vias may be formed to interconnect the metal layers 52 in a vertical direction. The metal layers 52 are encapsulated by an interlayer dielectric ILD 54 with contact pads 56 formed and exposed to electrically connect external devices.

As shown in FIG. 5, the device wafer 100 includes the interconnection structure 50 formed on the active devices 40 that is supported by a stack of a substrate 10, an etch stop layer 12, and a substrate layer 14. According to one embodiment, both the substrate 10 and the substrate layer 14 are made of Si, and the etch stop layer 12 is made of SiGe. After BEOL, the post-fab processes, including wafer testing, die separation, die testing, IC packaging, and final device testing are performed.

In the traditional post-fab process, the device wafer is diced into individual dies prior the IC packaging process. The continuous demand in size reduction of semiconductor die or chip creates the needs for new package designs that provides greater bandwidth and higher pin counts to interconnect the chips. Ways to reduce the dimension of the device wafer before performing complex back-end process have been developed in semiconductor industry. For example, wafer-level packaging (WLP) has been developed to replace the traditional die-level package which dices the device wafer into individual dies prior to IC packaging. In the WLP process, the device wafer is thinned down by removing a portion of the substrate before the wafer is diced into individual dies or chips.

The ultrathin wafer designs have the benefits of better heat dissipation, form factor reduction, increased performance, and decreased power consumption. However, the ultrathin wafers must be properly supported during the manufacturing flow. Temporary bonding techniques provide a reliable solution for handling ultrathin wafer by attaching the device wafer to a stable carrier without disrupting back-end processes. In the temporary bonding processes, the wafer device is reversibly mounted to a carrier. In some embodiment, a glass carrier is used as the carrier to carry the device wafer. The silicon substrate of the wafer device supported by the glass carrier is then thinned down to a desired thickness. The wafer device that has been thinned down is then separated from the glass carrier through a de-bond step and then diced into individual dies to be packaged separately.

In addition to the thin-down process, subsequent backside processes, including deposition, dry etching, wet etching, plating, and cleaning, may also be performed. The carrier made of glass may be unable to sustain these backside processes during the temporary bonding process and may consequently cause damage of to the device wafer. Therefore, alternative material may be selected for the carrier. In some embodiments, a carrier wafer may replace the glass carrier to mechanically support the device wafer during the backside process. The device wafer may be bonded to the carrier wafer using a bonding/debonding material. The properties of the bonding/debonding material largely control the stability of the entire structure during thinning and other processes.

Figure 6:
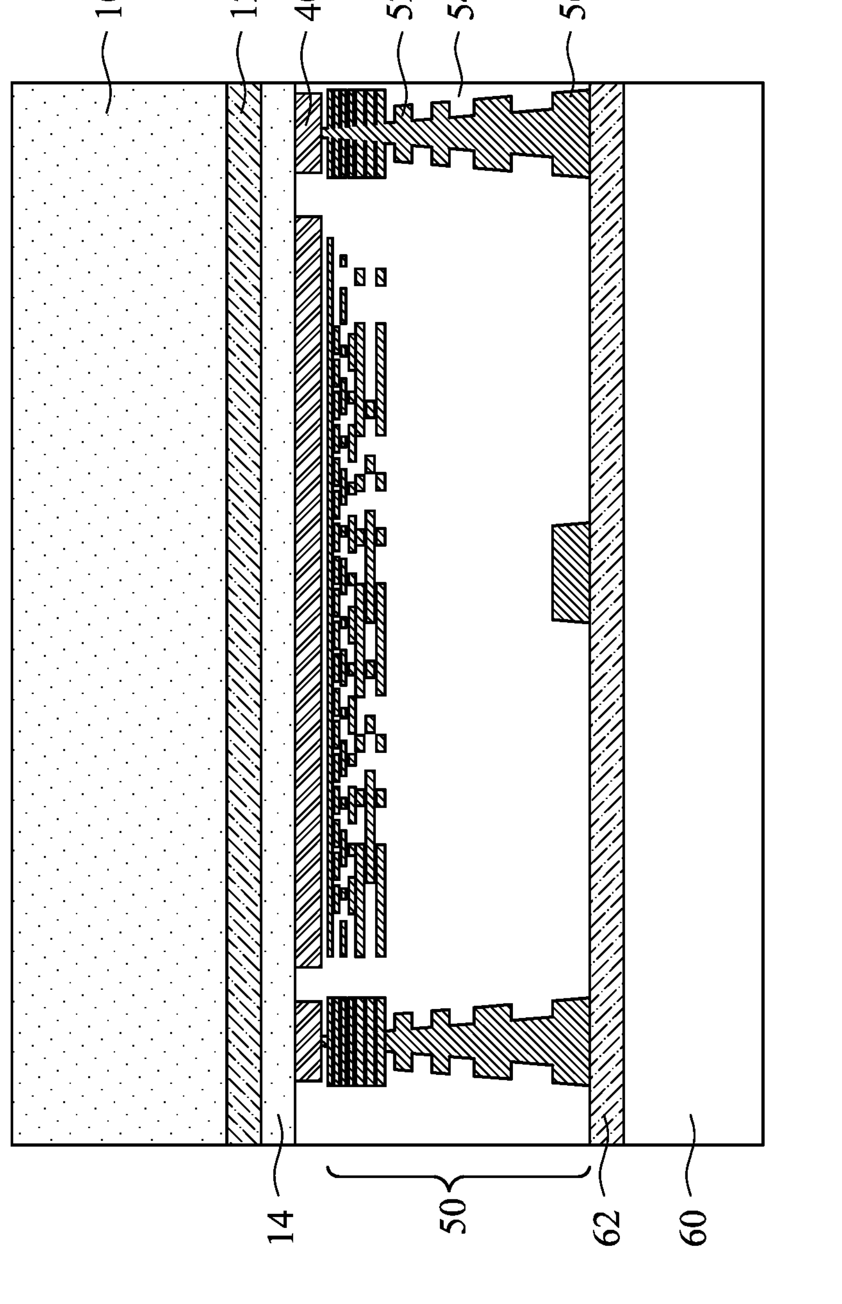

To provide a more reliable support of the device wafer in the temporary bonding process, as shown in FIG. 6, the device wafer 100 is temporarily bonded to a wafer carrier 60 and then flipped over with the substrate 10 on top and the interconnection structure 50 at the bottom. A bonding/debonding layer 62 is used to bond the interconnection structure 50 with the wafer carrier 60. Polymeric material has been commonly used for forming the bonding/debonding layer 62. In some embodiments, Tantalum nitride (TaN) that exhibits properties such as high melting point, high hardness, and chemical inertness may be used for forming the bonding/debonding layer 62. The TaN may provide improved wafer integrity and reduced cost compared to the polymeric material.

Figure 7:
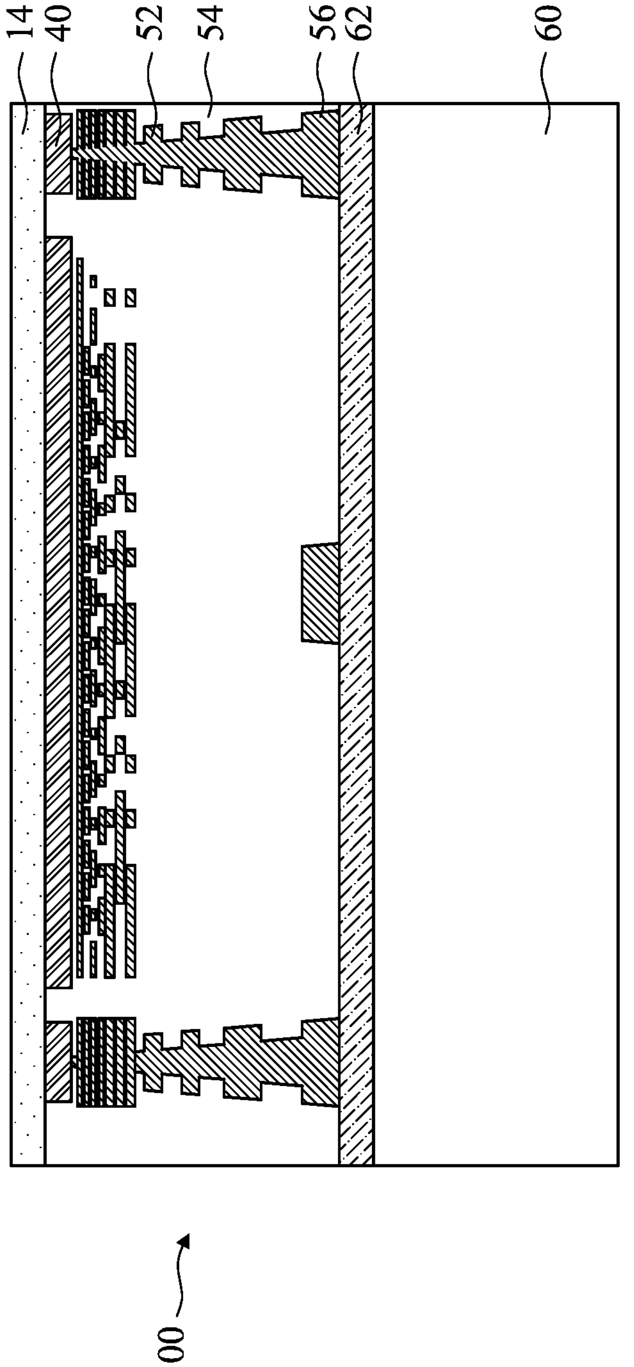

The substrate on which the semiconductor devices generating significant amount of heat is one of the key elements of the wafer device to efficiently dissipate the heat. The thermal conductivity k is a temperature-dependent parameter measured in W/mK, that is, the thermal energy per meter per temperature difference in Kelvin. The thermal conductivity k of silicon is about 150 W/mK, which is often too low to efficiently dissipate the heat generated from the semiconductor devices carried by the substrate, particularly when the device wafer includes an enormous number of devices in the nanoscales. Therefore, materials having higher thermal conductivity K is desired to replace the silicon to provide improve efficiency of heat dissipation. As shown in FIG. 7, instead of removing only a portion of the Si substrate 10, the substrate 10 is completely removed until the etch stop layer 12 is exposed. An etching process may be performed for the removal of the substrate. When the substrate 10 is made of Si and the etch stop layer 12 is made of SiGe, the etching selectivity of Si to SiGe may be controlled by selecting suitable etchant by adjusting appropriate etching temperature and etching pressure during the etching process. For example, isotropic etching using $CF_4/O_2/N_2$ and $NF_3/O_2/N_2$ based plasma may achieve a high selectivity of Si over SiGe.

The etch stop layer 12 is then removed until the semiconductor layer 14 is exposed. The semiconductor layer 14 serves as an etch stop for removing the etch stop layer 12. In the embodiment where the etch stop layer 12 is made of SiGe and the semiconductor layer 14 is made of Si, contrary to the etching step to remove the substrate 10, a higher etching rate or selectivity of Si over SiGe is required. A wet etching process using wet etchant such as ammonium hydroxide ($NH_4OH$), tetramethylammonium hydroxide (TMAH), ethylenediamine pyrocatechol (EDP), potassium hydroxide (KOH) solutions, or other suitable etchants may be used to selectively etch SiGe over Si. The removal of the substrate 10 and the etch stop layer 12 exposes the remaining semiconductor layer 14 in the form of a substrate mesa on the active devices 40 of the reversely disposed wafer device 100 as shown in FIG. 7.

Figure 8:
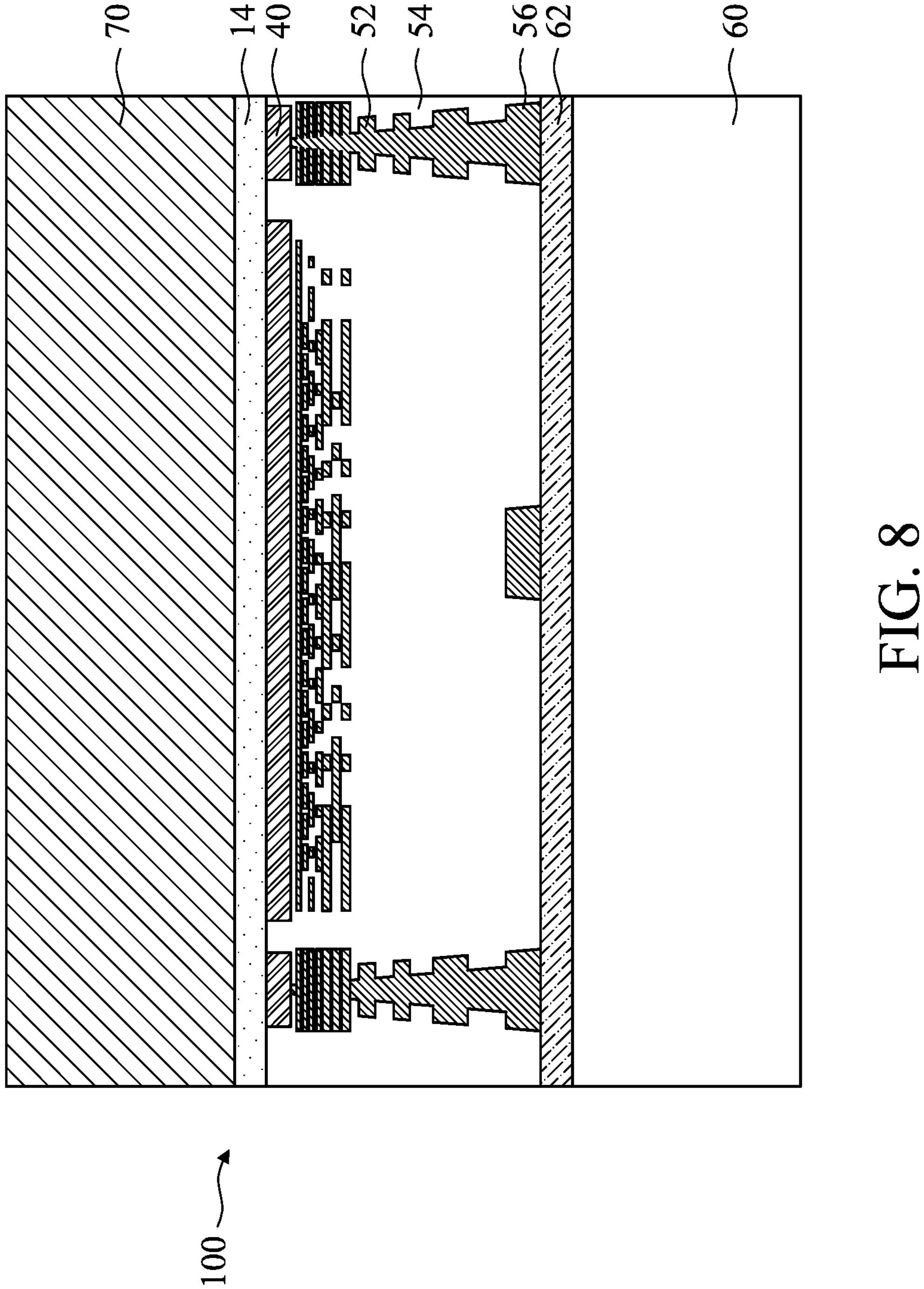

In FIG. 8, a cooling substrate layer 70 with a sufficiently high thermal conductivity is formed on the semiconductor layer 14. In some embodiments, the cooling substrate layer 70 covers the entire top surface of the semiconductor layer 14. The cooling substrate layer 70 is made of material that has a higher thermal conductivity than Si. In one embodiment, the cooling substrate layer 70 may be made of copper that has a thermal conductivity (K) greater than about 200 W/mK, such as from about 200 W/mK to about 400 W/mK. The cooling substrate layer 70 made of copper may bring the temperature of the Si substrate at about 62.7° C. to about 58.6° C. while simulated with a 20 W CPU power. That is, 6.5% of heat reduction may be achieved using a copper cooling substrate layer 70. Although copper has higher thermal conductivity compared to Si, it is easily deformed to degrade the chip integrity due to thermal stress. The copper cooling substrate layer 70 normally has a thickness limit of about 100 μm, while the traditional Si substrate may have a thickness of about 400 μm to about 600 μm without compromising chip integrity. Other materials such as silicon carbide (SiC), Aluminum (Al) having thermal conductivities between 200 W/mK and 400 W/mK may be used as alternatives of Cu for forming the cooling substrate layer 70. The thickness of the cooling substrate 70 using these alternative materials may range from 50 μm to 200 μm.

In addition to copper, the cooling substrate layer 70 may be formed from other high-K materials. For example, materials with thermal conductivity k as high as about or higher than 800 W/mK, or in some embodiments, higher than 1000 W/mK may be used for forming the cooling substrate layer 70. The high-materials include diamond-like carbon (DLC), cubic boron nitride (c-BN), boron arsenide (BAs), and other materials with similar physical characteristics. The cooling substrate layer 70 formed from these high-k materials may be made with a thickness larger than about 200 μm without compromising the chip integrity. Empirical data show that the cooling substrate layer 70 made of high-k material may bring the temperature of the Si substrate at 62.7° C. down to about 51.4° C. That is, the high-k cooling substrate may achieve 18% in heat reduction while simulated with a 20 W CPU power.

Figure 9:
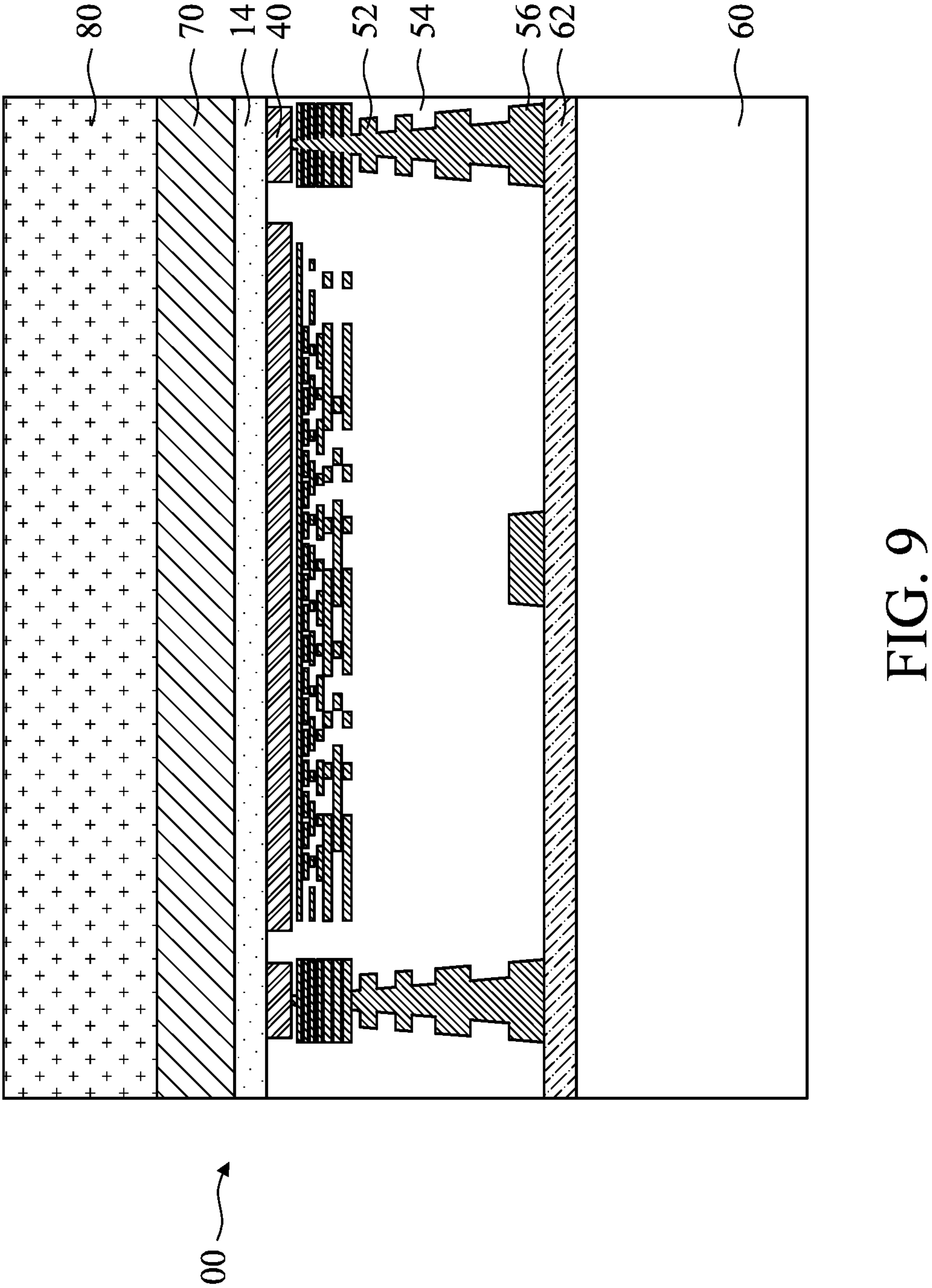

Although the ultrathin wafer provides various benefits as discussed above, the thin silicon wafers are fragile and difficult to handle due to their increased flexibility. In certain application, the thickness of the device wafer 100 may need to be increased without degrading the heat dissipation. Therefore, according to some embodiment, the single layer/single material structure of the cooling substrate layer 70 as shown in FIG. 8 may be modified into a multiple-layer structure, such that the overall substrate thickness may be increased. The overall substrate thickness may be tailored based on the specific need of the application. As shown in FIG. 9, the overall substrate thickness larger than 200 μm, for example, in the range of about 200 μm to about 500 μm, may be achieved by adding an additional substrate layer 80 on the cooling substrate layer 70. In some embodiments, the additional substrate layer 80 is in contact with the entire top surface of the cooling substrate layer 70.

In one embodiment, the cooling substrate layer 70 may be a Cu cooling substrate layer, and the additional substrate layer 80 may be made of Si. The additional substrate layer 80 may include a single-crystalline structure that has higher thermal conductivity compared to other forms of Si such as polycrystalline or amorphous Si. The additional substrate layer 80 may be formed by bonding another wafer to the cooling substrate layer 70. To bond a single crystalline Si wafer onto the Cu cooling substrate layer, a thin bonding film (not shown) may be used. However, such bonding layer is unnecessary when the additional substrate layer 80 is made in other forms of Si such as polysilicon. In operation, the additional substrate layer 80 is unlikely to cause significant degradation of heat dissipation as a substantial portion of the heat has been efficiently dissipated by the cooling substrate layer 70 before reaching the additional substrate layer 80. The additional substrate layer 80 relaxes the thickness restriction of the single-layer copper cooling substrate layer 70 to further ensure the wafer integrity without significantly compromising the heat dissipation efficiency.

The additional substrate layer 80 may also be formed on a cooling substrate layer 70 made of alternative materials such as SiC and Al. In some embodiments, the cooling substrate layer 70 using Cu, SiC, or Al may be made with a thickness of about 20 μm to about 200 μm, and the additional substrate layer 80 may be formed with a thickness of about 200 μm to about 500 μm. The additional substrate layer 80 may also be formed on the cooling substrate layer 70 made of high-K materials discussed above. The increased substrate thickness protects wafer devices from being damaged from mechanical or thermal stress during packaging process. In some embodiments, the additional substrate layer 80 made be made another high-k material layer according to some embodiments. In some embodiments, the cooling substrate layer 70 and the additional substrate layer 80 each has the same dimension as a semiconductor wafer. For example, the cooling substrate layer 70 and the additional substrate layer 80 each has a diameter of about 200 mm, 300 mm, 450 mm, or any other suitable number.

Figure 10:
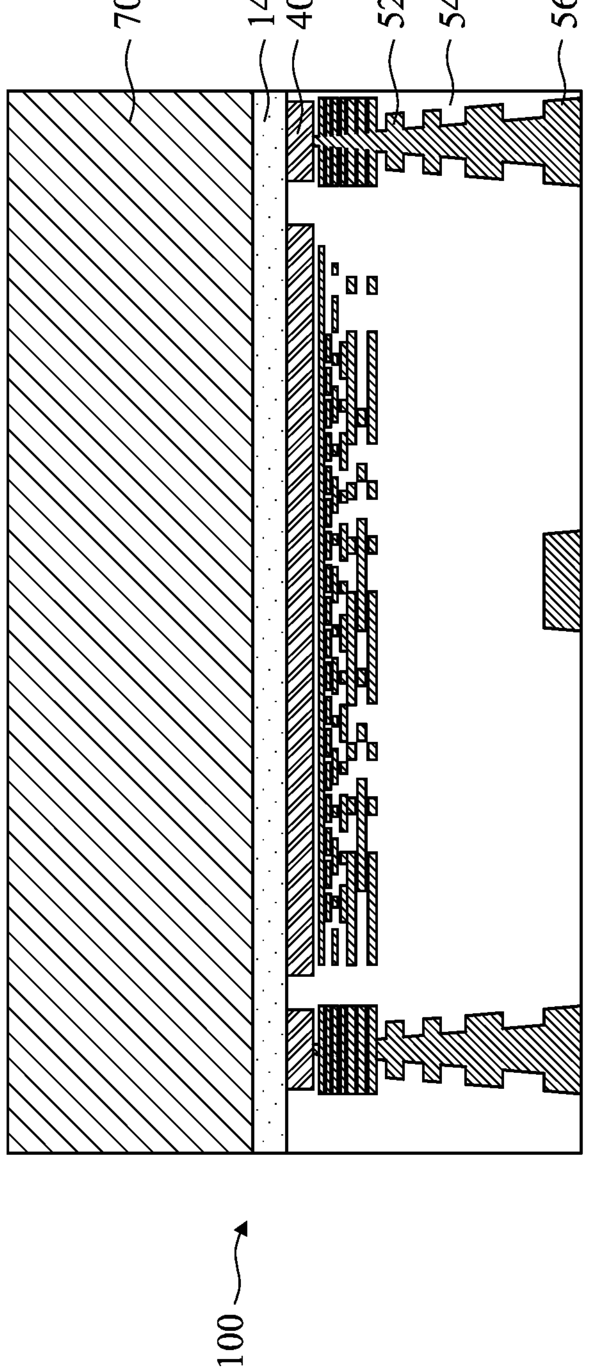

As shown in FIG. 10, the bonding/debonding layer 62 and the wafer carrier 60 are removed from the device wafer 100 through a debonding process. Depending on the material used for forming the bonding/deboning layer 62, three principal modes of debonding, including slide debonding, optic debonding, and mechanical debonding, may be used to remove in the debonding process.

The slide debonding takes the advantage of the reversible softening behavior of thermoplastic bonding material. In this mode, the bonded structure is heated above the softening temperature of the bonding material and an opposing shear force is applied to the device and device carrier to cause them to slowly slide past one another until the structure is separated. In the optic debonding mode, the bonding layer 62 may be selected made of laser sensitive material that ablates, that is, decomposes, while being exposed with laser radiation. The mechanical debonding is sometimes called peel separation. In this mode, peeling does not refer to removing a layer from the device wafer. Rather, it refers to separating the structure at an interface between the bonding material 60 and a surface-treated carrier 62. The debonding process involves initiating a crack between the two layers at the edge of the structure and then propagating the crack across the entire interface between the layers using very low force to cause separation. The use of a thermoplastic bonding material and a low-surface-energy polymeric release layer, which can be a curable or thermoplastic composition, are preferred for most mechanical debonding situations.

Figure 11:
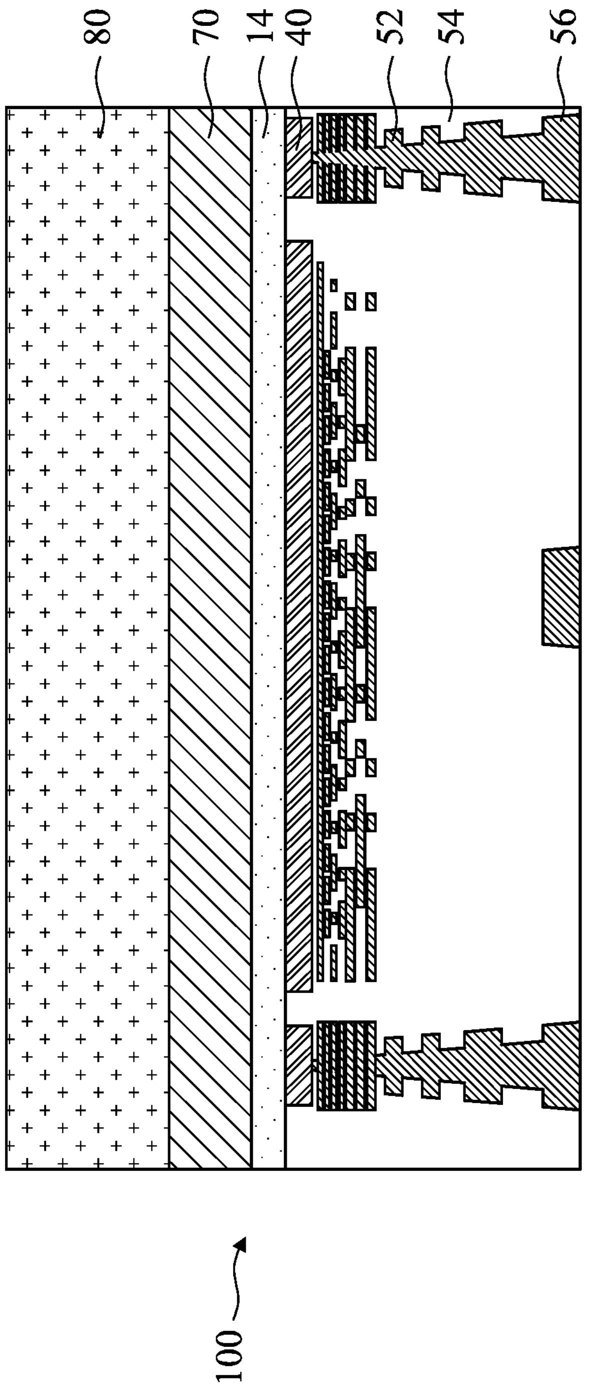

The same debonding process may be applied to the bonded structure in which the device wafer has a multiple-layer cooling substrate as shown in FIG. 9. FIG. 11 shows the device wafer 100 with multiple-layer substrate after the bonding/debonding layer 62 and the wafer carrier 60 have been removed through the debonding process.

Figure 12:
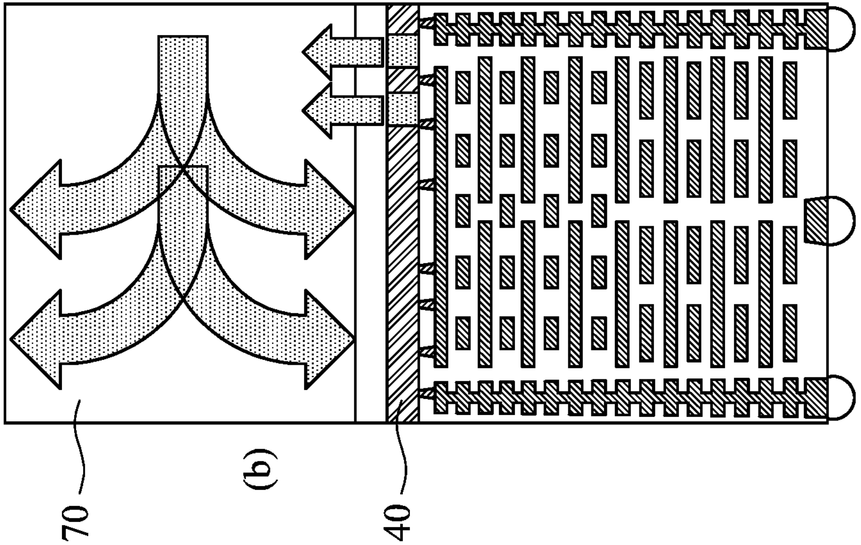
FIG. 12 is a comparison in heat dissipation between a conventional wafer device and a wafer device with improved heat dissipation.
Figure 12:
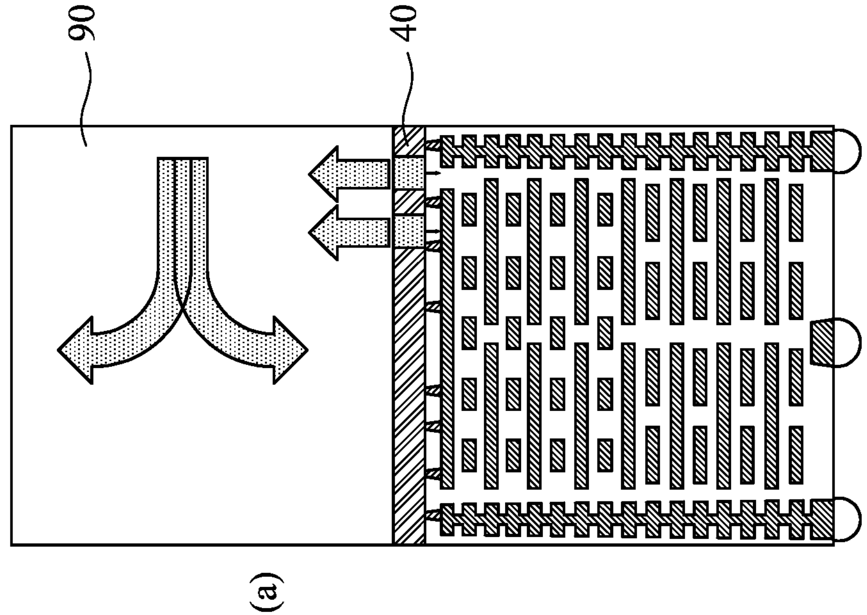

In FIG. 12, a comparison of heat dissipation between (a) the wafer device with the conventional Si substrate 90 and (b) the high-k material substrate is provided. As shown in the figure, the high-k material of the cooling substrate layer 70 enhances the thermal dissipation along both in-plane and out-of-plane directions. As shown in the figure, heat generated from the devices in the active devices 40 propagate towards the conventional Si substrate 90/cooling substrate layer 70. With the conventional Si substrate 90, the low thermal conductivity K of Si is unable to efficiently dissipate the heat. As a result, a substantial portion of the heat accumulated within the wafer device may damage the semiconductor devices. In contrast, the cooling substrate layer 70 made of high-K material provides sufficient paths along both in-plane and out-of-plane directions. The heat can thus be dissipated away from the wafer device without damaging the semiconductor devices thereof.

After the temporary bonding process, dicing process is performed to dice the wafer device 100 into individual dies or chips 110. The individual chips may be used in various applications, for example, in mobile devices or central-processing unit (CPU) of a computer. The integrated cooling substrate is formed independently with the subsequent package processes. That is, the integrated cooling substrate may be used in all package types applied in various applications.

Figures 13A, 13B:
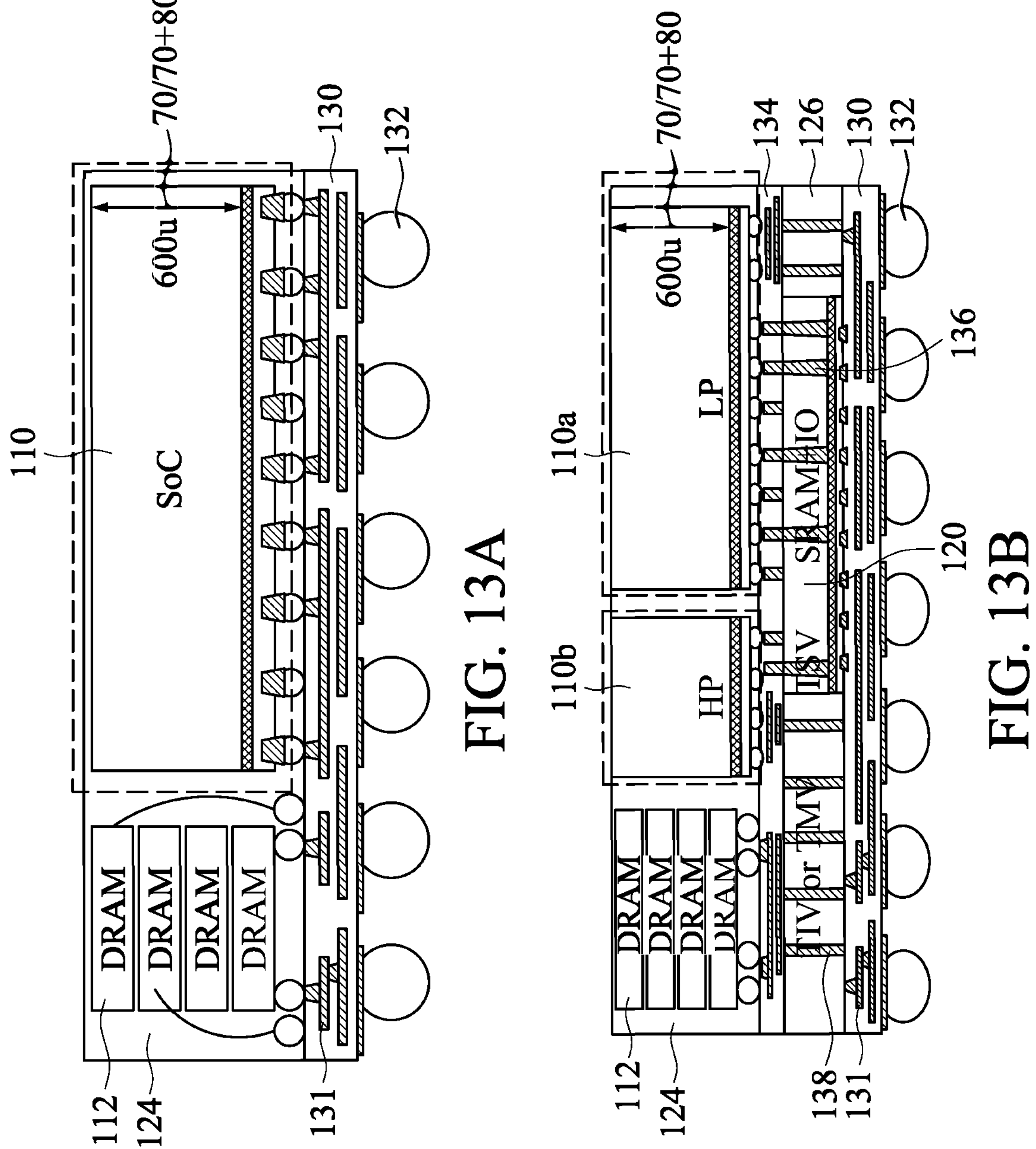
FIGS. 13A-13B and 14 shows the wafer device used in various types of packages for different applications.

FIGS. 13A and 13B show an integrated fan-out multi-chip module (InFO MCM) package in mobile application and an InFO 3D package in mobile application, respectively, in accordance with some embodiments. In semiconductor packaging, "fan-out" may be broadly defined as any package with connections fanned-out of the chip surface, thus enabling more external I/Os. For example, as shown in FIG. 13A, the structure that has been fanned out includes at least the silicon on chip (SoC) 110, or both the SoC 110 and a stack of DRAMs 112 arranged side-by-side on the redistribution layer (RDL) 130. The DRAMs 112 and one SoC 110 are encapsulated by a protection material (e.g., a mold) 124. The SoC 110 has a substrate thickness of about 600 μm. The substrate may include the same structure as the cooling substrate layer 70 as shown in FIG. 10 or the multi-layer structure such as stack of the cooling substrate layer 70 and the substrate layer 80 as described with reference to FIGS. 10 and 11, respectively. In some embodiments, the protection material 124 is in contact with the top and side surfaces of the cooling substrate layer 70. In some embodiments, the protection material 124 is in contact with the top surface of the substrate layer 80 and side surfaces of the substrate layer 80 and the cooling substrate layer 70. The SoC 110 and the DRAM 112 are electrically connected to the contacts 132 through the metal wiring 131 formed within the RDL 130. In other words, the connections of the SoC 110 and the DRAM 112 are redistributed by the RDL 130.

As shown in FIG. 13B, the mobile application of the InFO 3D package may include multiple dies stacked over a redistribution layer (RDL) 130. The top layer of dies includes a stack of four DRAMs 112 and two wafer dies arranged side-by-side on one side of an intermediate RDL 134. Each of the wafer dies 110*a* and 110*b* may include one cooling substrate layer 70 or a combination of one cooling substrate layer 70 and one substrate layer 80, for example. In one embodiment, the two wafer dies includes a low-power die (LP) 110*a* and a high-power die (HP) 110*b* arranged side by side with each other. The thickness of both the low-power die 110*a* and the high-power die 110*b* may be about 600 μm. The bottom layer of dies may include an SRAM and input/output (SRAM+IO) structure 120 between the intermediate RDL 134 and the bottom RDL 130. Connections between the DRAMs 112 to the contacts 132 located below the RDL 130 may be achieved by the RDL 134 and the formation of through mold via (TMV) or through insulator via (TIV) 140. Connections between the low- and high-power dies 110*a* and 110*b* and the contacts 132 may be achieved by formation of TIV 138 and/or through silicon via (TSV) 136. In some embodiments, after placing the DRAMs 124, the LP 110*a*, and the HP 110*b* on a carrier wafer (not shown), the intermediate RDL 130 is formed over the DRAMs 124, the LP 110*a*, and the HP 110*b*. Then, the SRAM+IO 120 is placed on the intermediate RDL 134 with the predefined TSV 138 aligned with the contacts of the intermediate RDL 134. A mold 126 may be formed to encapsulate the SRAM+IO structure 120. TIV (or TMV) 140 may be formed to extend through the mold 126 to provide the connection paths from the DRAMs 112, the LP 110*a*, and the HP 110*b* to the external contacts 132 of the RDL 130.

Figure 14:
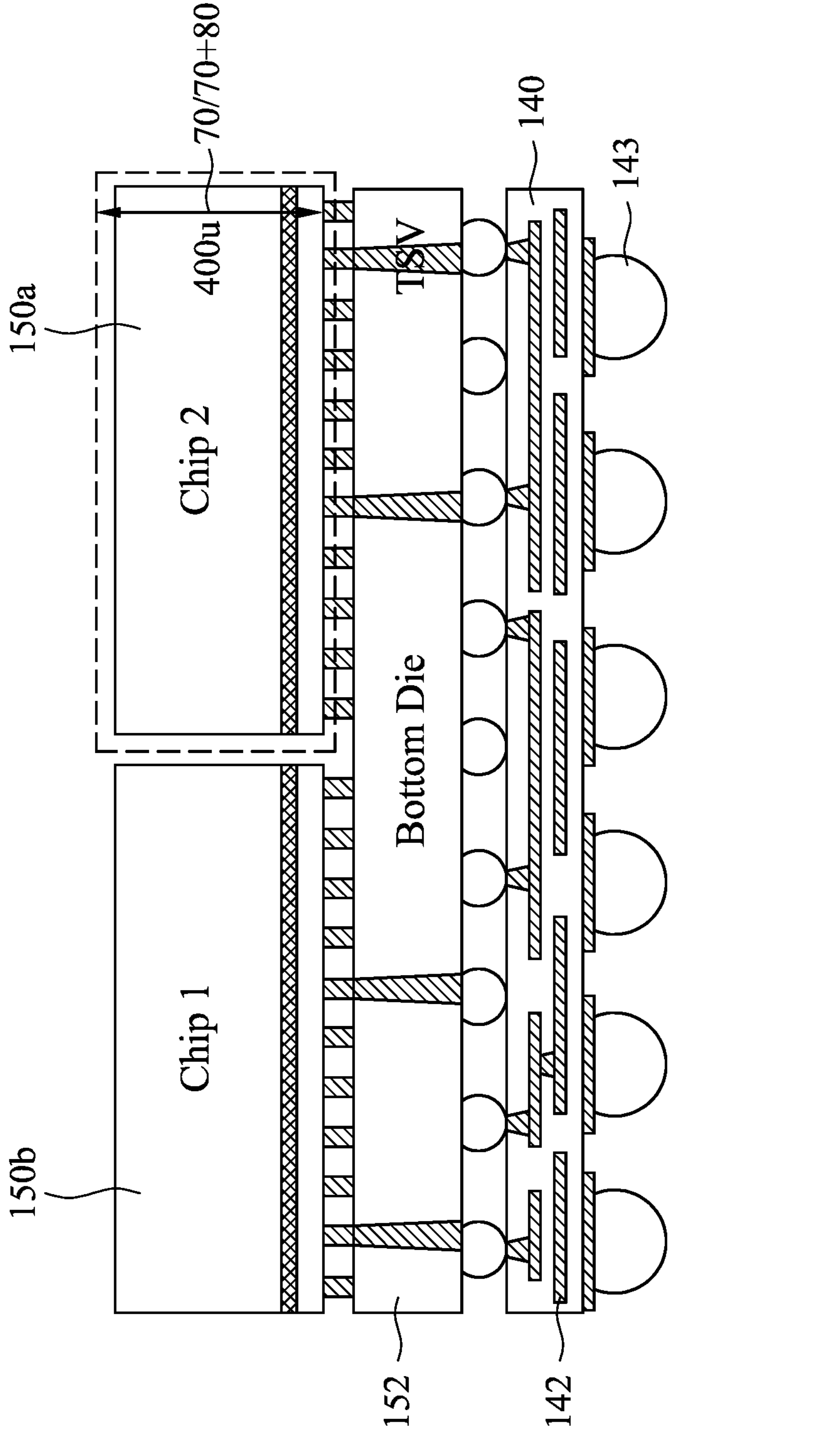

FIG. 14 shows the CPU application of a small outline integrated circuit (SoIC) package according to one embodiment. In the SoIC package, the interaction is vertical instead of horizontal like 2D and 2.5D. The SoIC advances the field of heterogenous chiplets integration with reduced size, increased performance. It features ultra-high-density-vertical stacking for high performance, low power, and minimum RLC (resistance-inductance-capacitance). SoIC integrates active and passive chips into the integrated system-on-chip system, which is electrically identical to native SoC to achieve better form factors. Such 3D IC inter-chip stacking technology allows integration of chiplets with multi-layers, multi-chip sizes and multi-functions.

Use of the cooling substrate layer 70 or the cooling substrate layer 70 along with the substrate layer 80 (70+80) provides further scalability and reliability in handling the wafer in the post fab processes. For example, as shown FIG. 14, two layers of chips may be stacked with each other on a RDL 140. The top layer includes a first chip 150*a* and a second chip 150*b*. The first chip 150*a* and the second chip 150*b* may be the same or different types of chips with the same or different functions. The first chip 150*a* and/or the second chip 150*b* includes the cooling substrate layer 70 or the cooling substrate layer 70 along with the substrate layer 80 with a thickness of about 400 μm. The bottom layer may include a bottom die 152 with similar to or different functions from those of the first chip 150*a* and/or the second chip 150*b*. Connection between the bottom die 152 to the external contacts 143 of the RDL 140 may be established through the external contact pads of the bottom die 152 and the wiring structure 142 formed in the RDL 140. The first chip 150*a* and the second chip 150*b* may be connected to the external contacts 143 via TSV extending through the bottom die 152 and the wiring structure 142 of the RDL 140.

Figure 15:
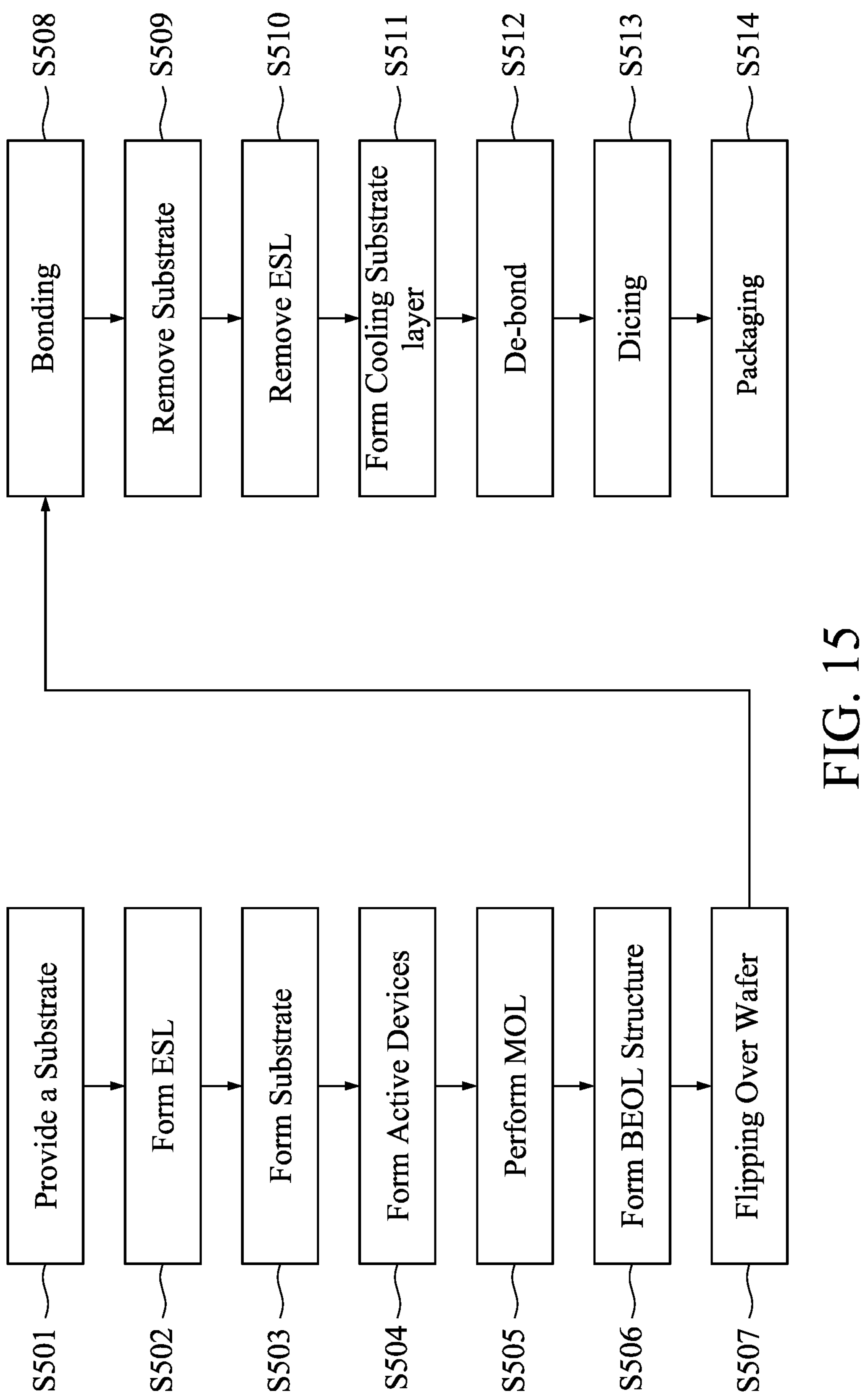
FIG. 15 is a process flow of a method for forming a wafer device with improved heat dissipation and wafer integrity during the post-fab process.

FIG. 15 shows the steps of a method to manufacture a semiconductor die with improved thermal properties and wafer integrity. The method starts with forming a substrate stack, including providing a substrate, such as the substrate 10, in Step 501, forming an etch stop layer, such as the etch stop layer 12, on the substrate in step S502, and forming a substrate layer, such as the substrate layer 14, on the etch stop layer in step 503. Some embodiments take the advantages of easy controlled etching selectivity between Si and SiGe and the mature and cost-effective technology for growing Si and SiGe on top of each other to form the Si—SiGe—Si as the substrate stack. It will be appreciated that other materials with the similar physical properties may also be used for forming the substrate, the etch stop layer, and the substrate layer of the substrate stack.

In step S504, various active and passive devices, such as the active devices 40, is formed on the substrate stack. Metal wirings to connect the various devices is performed by the MOL process in step S505, followed by formation of BEOL structure, that is, the interconnections, on the active devices in step S506. The wafer is then temporarily bonded with a carrier with a bonding/debonding layer in step S507. In one embodiment, the carrier is a carrier wafer, and the bonding/debonding layer is made of TaN that exhibits a promising sustainability for the subsequently back-side process and can be obtained in a low cost. Next, in step S508, the wafer is reversed with the substrate stack on top and the BEOL structure on the bottom. A wet, isotropic etch is performed to remove the substrate in step S509. Etchant and etch parameters such as etch temperature and etch pressure are selected to result in a high etching selectivity of the substrate over the etch stop layer. In S510, the etch stop layer is removed with the substrate layer as an etch stop. A wet etch using etchant under predetermined etch condition is performed to etch the etch stop layer with a high etching selectivity over the substrate layer. A material with high thermal conductivity is used for forming a cooling substrate layer on the substrate layer in step S511. The cooling substrate layer has a thermal conductivity higher than that of the substrate that has been removed to provide efficient dissipation of the heat generated from the devices of the device wafer. The cooling substrate layer may be the cooling substrate layer 70 or the cooling substrate layer 70 and the Si substrate layer 80. In step S512, the device wafer is de-bonded from the carrier and then diced into individual dies in step S513. The process of replacing the substrate with the cooling substrate layer and the temporary bonding process of the device wafer is independent of the applications. The individual dies may be used in all types of packages in various applications, for example, the mobile applications and the PC (CPU) applications, in step S514.

An embodiment is a method. The method includes depositing an etch stop layer on a substrate, depositing a first substrate layer on the etch stop layer, forming a plurality of active devices on the first substrate layer, forming an interconnection structure over the active devices, flipping over the substrate, removing the substrate, removing the etch stop layer to expose the first substrate layer, and forming a cooling substrate layer on the exposed first substrate layer. The cooling substrate layer has a thermal conductivity substantially greater than a thermal conductivity of the substrate.

Another embodiment is a method. The method includes depositing an etch stop layer on a substrate. The substrate includes a first semiconductor material, and the etch stop layer includes a second semiconductor material different from the first semiconductor material. The method further includes depositing a first substrate layer on the etch stop layer, and the first substrate layer includes the first semiconductor material. The method further includes forming a plurality of devices on the first substrate layer, flipping over the substrate, removing the substrate, removing the etch stop layer, and depositing a cooling substrate layer on the first substrate layer. The cooling substrate layer includes a material different from the first semiconductor material. The method further includes depositing a second substrate layer on the cooling substrate layer, and the second substrate layer includes the first semiconductor material.

A further embodiment is a semiconductor device structure. The structure includes an interconnection structure, a plurality of active devices disposed over the interconnection structure, and a first substrate layer disposed over the interconnection structure. The first substrate layer includes a semiconductor material having a first thermal conductivity. The structure further includes a cooling substrate layer disposed on and in contact with an entire top surface of the first substrate layer, and the cooling substrate includes a material having a second thermal conductivity substantially greater than the first thermal conductivity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

depositing an etch stop layer on a substrate;

depositing a first substrate layer on the etch stop layer;

forming a plurality of active devices on and in the first substrate layer;

forming an interconnection structure over the active devices;

flipping over the substrate;

removing the substrate;

removing the etch stop layer to expose the first substrate layer;

forming a cooling substrate layer on the exposed first substrate layer, wherein the cooling substrate layer has a thermal conductivity substantially greater than a thermal conductivity of the substrate; and forming a semiconductor layer on the cooling substrate layer.

2. The method of claim 1, wherein the substate comprises silicon, the etch stop layer comprises silicon germanium, and the first substrate layer comprises silicon.

3. The method of claim 1, further comprising bonding the interconnection structure to a carrier using a bonding/debonding layer before flipping over the substrate.

4. The method of claim 3, wherein the bonding/debonding layer comprises TaN.

5. The method of claim 1, wherein the thermal conductivity of the cooling substrate layer is between about 200 W/mK and about 400 W/mK.

6. The method of claim 1, wherein the cooling substrate layer comprises copper, silicon carbide, aluminum, diamond-like carbon, cubic boron nitride, or boron arsenide.

7. The method of claim 1, wherein the cooling substrate layer has a thickness ranging from about 50 μm to about 200 μm.

8. The method of claim 1, further comprising forming the semiconductor layer with the same material for forming the first substrate layer.

9. The method of claim 8, wherein the semiconductor layer comprises a silicon layer.

10. A method, comprising:

depositing an etch stop layer on a substrate, wherein the substrate comprises a first semiconductor material, and the etch stop layer comprises a second semiconductor material different from the first semiconductor material;

depositing a first substrate layer on the etch stop layer, wherein the first substrate layer comprises the first semiconductor material;

forming a plurality of devices on and in the first substrate layer;

flipping over the substrate;

removing the substrate;

removing the etch stop layer;

depositing a cooling substrate layer on the first substrate layer, wherein the cooling substrate layer comprises a material different from the first semiconductor material; and depositing a second substrate layer on the cooling substrate layer, wherein the second substrate layer comprises the first semiconductor material.

11. The method of claim 10, wherein the etch stop layer is epitaxially grown on the substrate.

12. The method of claim 11, wherein the first substrate layer is epitaxially grown on the etch stop layer.

13. The method of claim 10, wherein the plurality of devices comprises transistors having source/drain regions and gate electrode layers.

14. The method of claim 10, wherein the substrate is removed by a plasma etching process.

15. The method of claim 14, wherein the etch stop layer is removed by a wet etching process.

16. A semiconductor device structure, comprising:

an interconnection structure;

a plurality of active devices disposed over the interconnection structure;

a first substrate layer disposed over the interconnection structure, wherein the first substrate layer comprises a semiconductor material having a first thermal conductivity;

a cooling substrate layer disposed on and in contact with an entire top surface of the first substrate layer, wherein the cooling substrate layer comprises a material having a second thermal conductivity substantially greater than the first thermal conductivity; and a second substrate layer disposed on and in contact with a top surface of the cooling substrate layer, wherein the second substrate comprises a semiconductor material.

17. The semiconductor device structure of claim 16, wherein the cooling substrate layer has a thickness of about 20 μm to about 200 μm, and the second substrate layer has a thickness of about 200 μm to about 500 μm.

18. The semiconductor device structure of claim 17, wherein the cooling substrate layer comprises copper, silicon carbide, aluminum, diamond-like carbon, cubic boron nitride, or boron arsenide.

19. The semiconductor device structure of claim 17, wherein the second substrate layer comprises a single crystalline semiconductor material.

20. The semiconductor device structure of claim 17, wherein the second substrate layer comprises the material having the second thermal conductivity.

* * * * *